United States Patent [19]

Bai et al.

[11] Patent Number: 4,581,506

[45] Date of Patent: Apr. 8, 1986

[54] IMPACT SWITCH

[75] Inventors: Monty W. Bai, Scottsdale; Glynn F. Smith, Chandler, both of Ariz.

[73] Assignee: Motorola, Inc., Schaumburg, Ill.

[21] Appl. No.: 686,555

[22] Filed: Dec. 26, 1984

[51] Int. Cl.[4] ....................... H01H 35/14; H01L 41/08

[52] U.S. Cl. .......................... 200/61.45 R; 200/61.48; 310/329; 310/339

[58] Field of Search ....................... 200/61.45 R–61.53, 200/83 N; 310/329, 368, 348–352

[56] References Cited

U.S. PATENT DOCUMENTS

| | | | |
|---|---|---|---|
| 2,997,557 | 8/1961 | Gillmor et al. | 200/61.53 X |
| 3,097,272 | 7/1963 | Hautly | 200/61.49 |
| 3,256,762 | 6/1966 | Haas et al. | 200/61.49 X |
| 3,538,232 | 11/1970 | Bachtig et al. | 310/368 X |

*Primary Examiner*—J. R. Scott
*Attorney, Agent, or Firm*—Raymond J. Warren

[57] ABSTRACT

An apparatus and method is disclosed for providing an impact switch that is non-critical to temperature variations and preload pressures. The impact switch consists of a plate having a pair of parallel slots disposed therethrough defining a beam capable of flexing. A mass is located on one side of the beam and a piezoelectric crystal is located on the contact side of the beam. The plate is covered by a housing having a pin extending therethrough. The cover is placed such that when the required force is exerted on the beam it will flex causing the piezoelectric crystal and pin to come in contact thereby providing a voltage that will trigger the associated circuitry. The force required to make contact can be varied by changing the weight of the mass and/or the material or dimension of the beam.

1 Claim, 5 Drawing Figures

IMPACT SWITCH

BACKGROUND OF THE INVENTION

1. Field of the Invention

This invention relates, in general, to impact switches and, more particularly, to impact switches utilizing piezoelectric crystals.

2. Background Art

Various types of impact switches are known in the art. These types of switches have varied and numerous uses such as to detect an automobile impact. Among existing impact switches problems arise either with preload pressures, temperature variations or both. If the impact switch is strong enough to compensate for preload pressure it is often made too strong resulting in a failure to operate when needed. In addition, certain applications of these switches require larger signal-to-noise ratios than the prior art switches are capable of providing. Further, existing impact switches are of a type that are either on or off. This can cause problems when smaller objects may be impacted with enough force to turn the switch on. To determine whether the desired object has been impacted with the desired force an analog device having a non-linear output is necessary.

SUMMARY OF THE INVENTION

Accordingly, it is an object of the present invention to provide an impact switch and method of operation that will overcome the deficiencies of the prior art.

A further object of the present invention is to provide an impact switch and method of operation that has an improved signal-to-noise ratio.

Still another object of the present invention is to provide an impact switch and method of operation that has a non-linear output.

The above and other objects and advantages of the present invention are provided by an impact switch and method of operation consisting of placing a weighted element on a beam which will flex when the appropriate inertial load is applied causing a piezoelectric crystal to contact a pin thereby providing a voltage. The impact switch consists of a plate having a pair of parallel slots disposed therethrough defining a beam capable of flexing. A mass is located on one side of the beam and a piezoelectric crystal is located on the contact side of the beam. The plate is covered by a housing having a pin extending therethrough. The cover is placed such that when the required force is exerted on the beam it will flex causing the piezoelectric crystal and pin to come in contact thereby providing a voltage that will trigger the associated circuitry. The force required to make contact can be varied by changing the weight of the mass and/or the material or dimension of the beam.

A particular embodiment of the present invention consists of an impact switch having an input and an output. The impact switch comprises a beam, a piezoelectric crystal, and a cover. The beam is coupled to one of said input and output of the impact switch and the piezoelectric crystal is mounted on the beam. The cover of the impact switch has a contact point. The cover is fixedly mounted with respect to said beam such that when said flexible beam flexes said piezoelectric crystal will contact said contact point of said cover and said cover being coupled to the remaining one of said input and output of said impact switch.

DETAILED DESCRIPTION OF THE INVENTION

Figure 1:
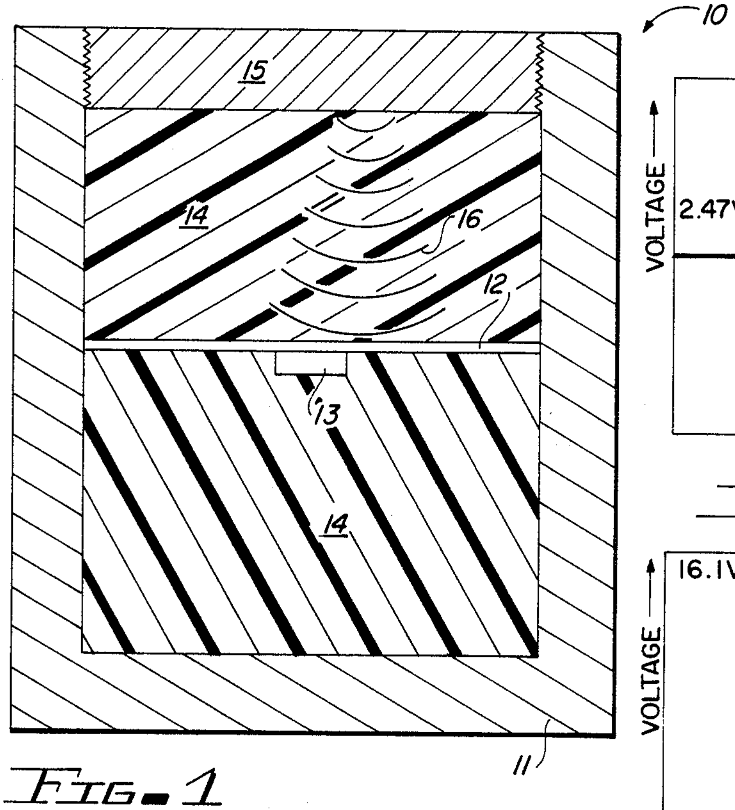
FIG. 1 (PRIOR ART)
FIG. 1 is a cross-sectional view of a prior art impact switch.
Figure 3:
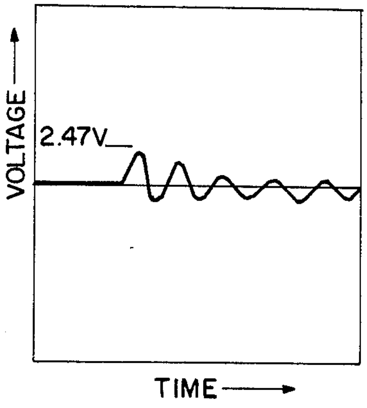
FIG. 3 is a graph of a noise signal output of an impact switch embodying the present invention.
Figure 4:
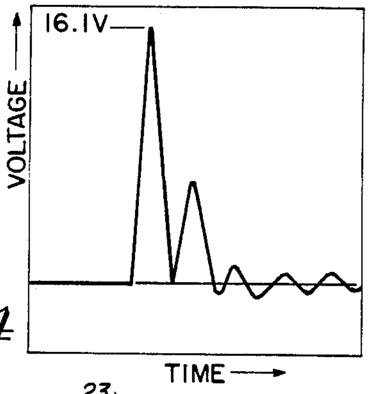
FIG. 4 is a graph of an impact signal output of an impact switch embodying the present invention.

Referring to FIG. 1 a cross-sectional view of a prior art impact switch, generally designated 10, is illustrated. Switch 10 has a housing 11 containing a printed circuit board 12 having a piezoelectric crystal 13 mounted thereon. Printed circuit board 12 is encased in a plastic 14. Plastic 14 is provided to seal printed circuit board 12. Above plastic 14 is a screw 15 that is used to apply a preload pressure to crystal 13. Upon impact a shock wave travels through plastic 14 in the direction of lines 16. This causes compression of crystal 13 which generates an electrical voltage proportional to the compression.

The disadvantage of prior art sensor 10 is derived from the materials utilized. The physical properties of plastic 14 will vary greatly with changes in exterior condition. Changes in temperature will vary the force needed to generate the desired voltage in crystal 13. In addition, the prior art device is subject to preload pressure. As screw 15 is tightened the pressure on crystal 13 increases causing an increase in the voltage. If impact switch 10 is set to go off when the voltage is 5 volts and screw 15 exerts enough pressure on switch 10 to reach 3 volts then only enough pressure to generate 2 more volts is needed to setoff switch 10. Therefore, screw 15 causes a change in the force required to setoff switch 10.

Figure 2:
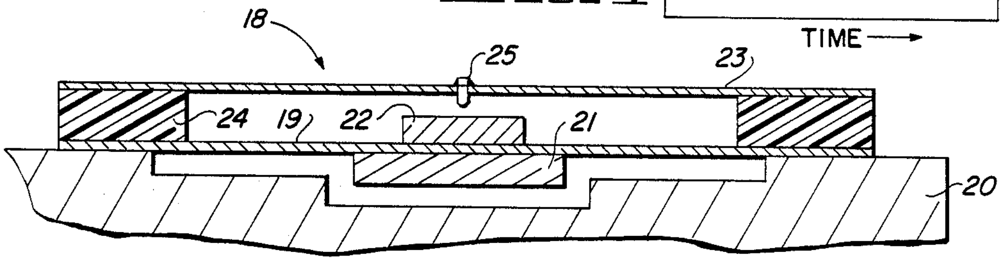
FIG. 2 is a cross-sectional view of an impact switch embodying the present invention.
Figure 5:
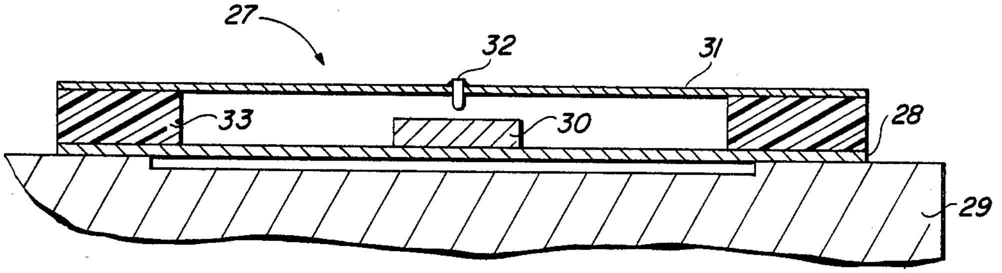
FIG. 5 is a cross-sectional view of another impact switch embodying the present invention.

Referring now to FIG. 2 a cross-sectional view of an impact switch, generally designated 18, embodying the present invention is illustrated. Switch 18 consists of a conductive beam 19, which is capable of flexing, mounted on a base 20. Base 20 may be made of either insulative or conductive materials depending on the surrounding conditions. Mounted to beam 19, in a space between beam 19 and base 20, is a mass 21. A piezoelectric crystal 22 is mounted on beam 19 above mass 21. Above beam 19 is mounted a conductive cover 23 on spacers/insulators 24 separating cover 23 from beam 19. It should be noted that spacers 24 may be part of cover 23 and need not be a separate item. A contact pin 25 is mounted on cover 23 extending therethrough into the area between crystal 22 and cover 23.

In addition, cover 23 need not be conductive, but may be insulative with a conductor, such as a wire (not shown), coupled to pin 25. Additional views of portions of this device may be found in co-pending application having Ser. No. 686,556 and assigned to Motorola, Inc.

Upon impact with an exterior object a force is exerted on beam 19 causing it to flex upward bringing pin 25 into contact with crystal 22. The more pressure that is applied to crystal 22 the larger the output voltage. As a result an analog signal is produced by crystal 22 that is measured in attached circuitry (not shown). When the voltage reaches a predetermined level a switch, a por-